(12) United States Patent
Kishimoto et al.

(10) Patent No.: US 6,733,935 B2
(45) Date of Patent: May 11, 2004

(54) COLORED RESIST MATERIAL SET AND COLOR FILTER

(75) Inventors: Takehide Kishimoto, Tokyo-to (JP); Miho Watanabe, Tokyo-to (JP)

(73) Assignee: Dai Nippon Printing Co., Ltd., Tokyo-to (JP)

(*) Notice: Subject to any disclaimer, the term of this patent is extended or adjusted under 35 U.S.C. 154(b) by 321 days.

(21) Appl. No.: 09/932,710

(22) Filed: Aug. 17, 2001

(65) Prior Publication Data

US 2002/0045112 A1 Apr. 18, 2002

(30) Foreign Application Priority Data

Aug. 22, 2000 (JP) ......................... 2000-250870

(51) Int. Cl.$^7$ ........................... G02B 5/20; G03F 1/1335
(52) U.S. Cl. ......................... 430/7; 430/270.1
(58) Field of Search ................. 430/7, 270.1

(56) References Cited

U.S. PATENT DOCUMENTS 6,414,733 B1 * 7/2002 Ishikawa et al. ............ 349/110
6,495,298 B1 * 12/2002 Fujishiro et al. ............. 430/7

FOREIGN PATENT DOCUMENTS

| JP | 9134006 | 5/1997 |
| JP | 9-166708 A | * 6/1997 |
| JP | 0010315 | 1/1998 |
| JP | 0039512 | 2/2000 |

* cited by examiner

Primary Examiner—John A. McPherson
(74) Attorney, Agent, or Firm—Ladas & Parry

(57) ABSTRACT

Provided is a set material of photoinitiators which prevent a reduction in the light transmittance of each colored resist. The colored resist material set comprises at least colored resist materials having three colors and consisting of a red resist material, a green resist material and a blue resist material, each resist material containing a reactive monomer, a photoinitiator and a dye and/or a pigment, wherein the photoinitiator contained in the red resist material has a photoabsorption region on the side of wavelengths shorter than 570 nm, the photoinitiator contained in the green resist material has a photoabsorption region on the side of wavelengths shorter than 460 nm, and the photoinitiator contained in the blue resist material has a photoabsorption region on the side of wavelengths shorter than 400 nm, each photoinitiator using at least two or more photoinitiators.

6 Claims, No Drawings

COLORED RESIST MATERIAL SET AND COLOR FILTER

BACKGROUND OF THE INVENTION

The present invention relates to a colored resist material set used to form colored resists of three colors (red (R), Green (G) and blue (B)) in a color filter which is preferably used in color televisions, liquid crystal display elements, cameras and the like and also to a color filter formed with colored resists by the colored resist material set.

In these days, there is a tendency that demands for liquid crystal displays, especially, color liquid crystal displays are increasing along with the progress of, particularly, portable personal computers. Because the color liquid crystal display is expensive, there is increasing needs to lower the cost, particularly increasing needs to lower the cost of a color filter occupying a large part of the cost of the color liquid crystal display.

In such a color filter, generally colored resists of three primary colors of red (R), green (G) and blue (B) respectively are provided and a liquid crystal works as a shutter by switching electrodes corresponding to each pixel of R, G and B on and off whereby light passes through each resist of R, G and B to display colors.

The following method is among methods of producing such a color filter. Specifically, a resist material (light-sensitive resin) containing a photoinitiator is applied every color on a transparent substrate. A mask in which only the area to be colored is made transparent is brought into contact with the resist material and the mask is irradiated with light to thereby cause a difference in solubility between the part irradiated with light and the part non-irradiated with light. Namely, only the resist material corresponding to the part irradiated with light is cured by the action of the aforementioned photoinitiator (exposure step). Next, the resist material is developed to form a pattern (developing step), followed by post-baking (film-forming step) to form a monocolor resist pattern. This operation for each resist material of R, G and B is repeated three times to form a colored layer.

As the photoinitiator used in this method, those which can cure the resist material in a shorter time, namely those absorbing light having a wide range of wavelengths have been used.

However, the photoinitiator is a type which is left unremoved in the resist after the resist material is cured with the result that the following problems sometimes arise.

It is supposed that a resist material is cured by making the resist material absorb light having a wavelength shorter than 440 nm. Specifically, in the case of forming a red (R) resist, green (G) resist and blue (B) resist respectively by using a resist material containing a photoinitiator having a photoabsorption region on the side of wavelengths shorter than 440 nm, the photoinitiator left in the formed resists having three colors respectively absorbs light having wavelengths shorter than 440 nm even after the resists are formed, namely in the case where these resist materials function as a color filter.

Here, generally the light having wavelengths of about 400 to 570 nm represents blue light, the light having wavelengths of about 460 to 650 nm represents green light and the light having wavelengths of about 570 to 700 nm represents red light.

Therefore, when three color (R, G and B) resists are formed using the aforementioned photoinitiator (absorbing light having wavelengths shorter than 440 nm), there is no influence on the light transmittance of each of the red (R) resist and the green (G) resist, even if the photoinitiator is contained (because this photoinitiator is a type which does not absorb light having wavelengths longer than 440 nm). However, in the blue (B) resist, the photoinitiator resultantly absorbs a part the blue light which is transmitting through the resist, which causes the light transmittance of the blue resist to decrease consequently.

The reduction in the light transmittance of the blue resist leads to the upset of the white balance (the balance of chromaticity and/or luminance between R, G and B) of whole pixels, giving rise to the problem concerning the luminance and tint of a liquid crystal display and the like.

SUMMARY OF THE INVENTION

The present invention has been made in view of the above problems and it is an object of the present invention to provide a colored resist material set which prevents a reduction in the light transmittance of each colored resist and also to provide a color filter which is not reduced in the light transmittance of a colored resist by using the above set.

The above objects are achieved by the following inventions. According to a first aspect of the present invention, there is provided a colored resist material set comprising at least colored resist materials having three colors consisting of a red resist material, a green resist material and a blue resist material, each resist material containing a reactive monomer, a photoinitiator and a dye and/or a pigment, wherein the photoinitiator contained in the red resist material has a photoabsorption region on the side of wavelengths shorter than 570 nm, the photoinitiator contained in the green resist material has a photoabsorption region on the side of wavelengths shorter than 460 nm and the photoinitiator contained in the blue resist material has a photoabsorption region on the side of wavelengths shorter than 400 nm, each photoinitiator using at least two or more photoinitiators.

In the present invention, the photoinitiator to be used in each colored resist material is combined according to the wavelength of each color. Since the photoabsorption region of the photoinitiator used to cure each resist material is on the side of wavelengths shorter than the wavelength of each color (R, G and B), the photoinitiator does not decrease the light transmittance of the resist after the resist is formed, whereby the luminance and tint of, for example, a liquid crystal display can be exhibited to the maximum.

In the present invention, the photoinitiators contained in the red resist material and the green resist material respectively are preferably the same photoinitiator having a photoabsorption region on the side of wavelengths shorter than 460 nm.

Because many photoinitiators used currently have a photoabsorption region on the side of shorter wavelengths, blue light having the shortest wavelength among three primary color lights is much affected by the photoinitiator. Therefore, if only the photoinitiator contained in the blue resist material has a photoabsorption region on the side of wavelengths shorter than 400 nm and the photoinitiators contained in other two colored resist materials are the same photoinitiator having a photoabsorption region on the side of wavelengths shorter than 460 nm, the effect of the present invention can be produced, specifically, a reduction in the light transmittance of each resist can be prevented, whereby the luminance and tint of, for example, a liquid crystal display can be exhibited to the maximum.

In the present invention, preferably the photoinitiators contained in the red resist material and the green resist material respectively are 2-benzyl-2-dimethylamino-1-(4-morpholinophenyl)-butanone-1 and the photoinitiator contained in the blue resist material is 2-methyl-1[4-(methylthio)phenyl]-2-morpholinopropan-1-one.

This is because 2-benzyl-2-dimethylamino-1-(4-morpholinophenyl)-butanone-1 is placed on the market as Irgacure 369 (trademark, manufactured by Ciba Specialty Chemicals) and 2-methyl-1[4-(methylthio)phenyl]-2-morpholinopropan-1-one is placed on the market as Irgacure 907 (trademark, manufactured by Ciba Specialty Chemicals) and the both are therefore easily available and can be used conveniently.

Further, according to a second aspect of the present invention, there is provided a color filter comprising forming a colored resist by using the aforementioned colored resist material set.

The color filter provided with the colored resists formed using the colored resist material set according to the present invention ensures that the light transmittance of the colored resist is not reduced and the white balance of the whole pixels is not destroyed to thereby improve the luminance and tint of, for example, a liquid crystal display.

According to the present invention, the photoabsorption region of each photoinitiator used for the curing of resist materials is on the side of wavelengths lower than the wavelength of each color (R, G and B) and therefore a reduction in the light transmittance of each resist obtained after the formation of the resist can be prevented, whereby the luminance and tint of, for example, a liquid crystal display can be exhibited to the maximum.

DETAILED DESCRIPTION OF THE PREFERRED EMBODIMENTS

A colored resist material set according to the present invention will be hereinafter explained in detail.

The colored resist material set of the present invention is used when three color (red (R), green (G) and blue (B)) resists disposed in a color filter are formed and comprises at least a red resist material for forming a red resist, a green resist material for forming a green resist and a blue resist material for forming a blue resist.

These colored resist materials having three colors respectively comprise the components shown below.

[Red Resist Material]

(1) Reactive monomer.
(2) Photoinitiator having a photoabsorption region on the side of wavelengths shorter than 570 nm.
(3) Dyes and/or pigments
(4) Additives such as a dispersant.

[Green Resist Material]

(1) Reactive monomer.
(2) Photoinitiator having a photoabsorption region on the side of wavelengths shorter than 460 nm.
(3) Dyes and/or pigments
(4) Additives such as a dispersant.

[Blue Resist Material]

(1) Reactive monomer.
(2) Photoinitiator having a photoabsorption region on the side of wavelengths shorter than 400 nm.
(3) Dyes and/or pigments
(4) Additives such as a dispersant.

These colored resist materials having three colors respectively and constituting the colored resist material set of the present invention respectively comprise a reactive monomer, a photoinitiator, dyes and/or pigments and as required, additives such as a dispersant as aforementioned wherein each photoinitiator has peculiar characteristics. Each structural component of the colored resist material of the present invention will be hereinafter explained in detail.

(1) Reactive Polymer

The reactive polymer to be contained in the colored resist material means a monomer whose polymerization is induced by a radical generated caused by the light absorption of a photoinitiator as will be explained later. Any monomer having these characteristics may be used in the present invention. As these monomers, compounds having at least one polymerizable carbon—carbon unsaturated bond maybe used. Specific examples of these monomers include allylacrylate, benzylacrylate, butoxyethylacrylate, butoxyethylene glycol acrylate, cyclohexylacrylate, dicyclopentanylacrylate, 2-ethylhexylacrylate, glycerol acrylate, glycidylacrylate, 2-hydroxyethylacrylate, 2-hydroxypropylacrylate, isobornylacrylate, isodexylacrylate, isooctylacrylate, laurylacrylate, 2-methoxyethylacrylate, methoxyethylene glycol acrylate, phenoxyethylacrylate, stearylacrylate, ethylene glycol diacrylate, diethylene glycol diacrylate, 1,4-butanediol diacrylate, 1,5-pentanediol diacrylate, 1,6-hexanediol diacrylate, 1,3-propanediol acrylate, 1,4-cyclohexanediol diacrylate, 2,2-dimethylolpropanediacrylate, glycerol diacrylate, tripropylene glycol diacrylate, glycerol triacrylate, trimethylolpropanetriacrylate, polyoxyethylated trimethylolpropane triacrylate, pentaerythritol triacrylate, pentaerythritol tetraacrylate, triethylene glycol diacrylate, polyoxypropyltrimethylolpropanetriacrylate, butylene glycol diacrylate, 1,2,4-butanetriol triacrylate, 2,2,4-trimethyl-1,3-pentanediol diacrylate, diallyl fumarate, 1,10-decanediol dimethylacrylate, dipentaerythritol hexaacrylate, and compounds obtained by substituting the acrylate groups in the above compounds with methacrylate groups, acrylate monomers such as γ -methacryloxypropyltrimethoxysilane, 1-vinyl-2-pyrrolidone, 2-hydroxyethylacryloyl phosphate, tetrahydrofurfurylacrylate, dicyclopentenylacrylate, dicyclopentenyloxyethylacrylate, 3-butanediol diacrylate, neopentyl glycol diacrylate, polyethylene glycol diacrylate, hydroxypivalic acid ester neopentyl glycol diacrylate, phenol-ethylene oxide modified acrylate, phenol-propylene oxide modified acrylate, N-vinyl-2-pyrrolidone, bisphenol A-ethylene oxide modified diacrylate, pentaerythritol diacrylate monostearate, tetraethylene glycol diacrylate, polypropylene glycol diacrylate, trimethylolpropanepropylene oxide modified triacrylate, isocyanuric acid ethylene oxide modified triacrylate, trimethylolpropaneethylene oxide modified triacrylate, pentaerythritol pentaacrylate, pentaerythritol hexaacrylate and pentaerythritol tetraacrylate, and compounds obtained by substituting the acrylate groups in these compounds with methacrylate groups, urethaneacrylate oligomers obtained by combining an acrylate group with oligomers having a polyurethane structure, polyesteracrylate oligomers obtained by combining an acrylate group with oligomers having a polyester structure, epoxyacrylate oligomers obtained by combining an acrylate group with oligomers having an epoxy group, urethanemethacrylate oligomers obtained by combining a methacrylate group with oligomers having a polyurethane structure, polyestermethacrylate oligomers obtained by combining a methacrylate group with oligomers having a polyester structure, epoxymethacrylate oligomers obtained by combining a methacrylate group with oligomers having an epoxy group, polyurethaneacrylate having an acrylate group, polyesteracrylate having an acrylate group, epoxyacrylate resins having an acrylate group, polyurethanemethacrylate having a methacrylate group, polyestermethacrylate having a methacrylate group and epoxymethacrylate resins having a methacrylate group.

These compounds are a part of monomers which can be used in the present invention. The monomer used in the present invention is not limited to these compounds. The content of the monomer is in a range from 10 to 90% by weight and preferably 20 to 80% by weight based on the nonvolatile components of the resin composition.

The aforementioned prepolymers or monomers may be used either singly or by mixing two or more. Among these monomers, polyfunctional acrylate monomers having three or more functional groups may be used preferably.

(2) Photoinitiator

The photoinitiator contained in the colored resist material of the present invention absorbs light to generate radicals for initiating the polymerization reaction of the aforementioned reactive monomer.

The present invention is characterized by the use of different photoinitiators as the photoinitiators contained in each colored resist material according to a difference in photoabsorption region between these photoinitiators. Specifically, the present invention is characterized by the fact that the red resist material contains a photoinitiator having a photoabsorption region on the side of wavelengths shorter than 570 nm, the green resist material contains a photoinitiator having a photoabsorption region on the side of wavelengths shorter than 460 nm and the blue resist material contains a photoinitiator having a photoabsorption region on the side of wavelengths shorter than 400 nm.

Generally, the human eye is considered to be able to recognize the light having wavelengths between 400 and 700 nm, among which the light having wavelengths between about 400 and 570 nm is designated as blue light, the light having wavelengths between about 460 and 650 nm is designated as green light and the light having wavelengths between about 570 and 700 nm is designated as red light.

Therefore, in colored resists having three colors respectively in a color filter used in, for example, a liquid crystal display, a resist which transmits the light, namely blue light, having wavelengths of about 400 to 570 nm as much as possible is preferable if the resist is a blue resist, a resist which transmits the light, namely green light, having wavelengths of about 460 to 650 nm as much as possible is preferable if the resist is a green resist and a resist which transmits the light, namely red light, having wavelengths of about 570 to 700 nm as much as possible is preferable if the resist is a red resist. This is because the more the resist transmits the light having such a wavelength region, the more greatly the luminance and tint of a liquid crystal display can be improved.

In the present invention, the photoinitiator contained in the red resist material has a photoabsorption region on the side of wavelengths shorter than 570 nm, specifically it never absorbs the light having wavelengths longer than 570 nm. Therefore, even if a red resist utilizing the red resist material according to the present invention is used, there is no influence on the luminance and tint. Similarly, the photoinitiator contained in the green resist material has a photoabsorption region on the side of wavelengths shorter than 460 nm and the photoinitiator contained in the blue resist material has a photoabsorption region on the side of wavelengths shorter than 400 nm, whereby an adverse influence on the luminance and tint can be excluded.

The colored resist set of the present invention contains the photoinitiators having no adverse influence on each of the aforementioned colors (R, G and B). Therefore, if a colored resist is formed by the resist set and a liquid crystal display is formed using a pixel portion containing the colored resist, the luminance and tint can be more improved than those of conventional crystal displays.

As to the photoinitiators usable in the present invention, any material may be used without any particular limitation as far as it has the aforementioned photoabsorption region and generates radicals required to polymerize the aforementioned reactive monomer.

Examples of the initiator usable for the resist set of the present invention include aromatic ketones such as benzophenone, Michler's ketone, N,N'-tetramethyl-4,4'-diaminobenzophenone, 4-methoxy-4'-dimethylaminobenzophenone, 4,4'-diethylaminobenzophenone, 2-ethylanthraquinone and phenanthrene, benzoin ethers such as benzoinmethyl ether, benzoinethyl ether and benzoinphenyl ether, benzoins such as methylbenzoin and ethylbenzoin, halomethylthiazole compounds such as 2-(o-chlorophenyl)-4,5-phenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2,4,5-triarylimidazole dimer, 2,2'-bis(o-chlorophenyl)-4,5,4',5'-tetraphenyl-1,2'-biimida zole, 2-benzyl-2-dimethylamino-1-(4-morpholinophenyl)-butanone, 2-trichloromethyl-5-styryl-1,3,4-oxadiazole, 2-trichloromethyl-5-(p-cyanostyryl)-1,3,4-oxadiazole and 2-trichloromethyl-5-(p-methoxystyryl)-1,3,4-oxadiazole, halomethyl-S-triazine type compounds such as 2,4-bis (trichloromethyl)-6-p-methoxystyryl-S-triazine, 2,4-bis (trichloromethyl)-6-(1-p-dimethylaminophenyl-1,3-but adienyl)-S-triazine, 2-trichloromethyl-4-amino-6-p-methoxystyryl-S-triazine, 2-(naphtho-1-yl)-4,6-bis-trichloromethyl-S-triazine, 2-(4-ethoxy-naphtho-1-yl)-4,6-bis-trichloromethyl-S-triazin e and 2-(4-butoxy-naphtho-1-yl)-4,6-bis-trichloromethyl-S-triazin e and photoinitiators such as 2,2-dimethoxy-1,2-diphenylethan-1-one, 2-methyl-1-[4-(methylthio)phenyl]-2-morpholinopropanone, 1,2-benzyl-2-dimethylamino-1-(4-morpholinophenyl)butanone-1,1-hydroxy-cyclohexyl-phenyl ketone, 2-benzyl-2-dimethylamino-1-(4-morpholinophenyl)-butanone-1 (Irgacure-369, manufactured by Ciba Specialty Chemicals), Irgacure-651 (manufactured by Ciba Specialty Chemicals) and 2-methyl-1[4-(methylthio)phenyl]-2-morpholinopropan-1-one (Irgacure-907, manufactured by Ciba Specialty Chemicals). In the present invention, these photoinitiators may be used either singly or by mixing two or more.

The amount of the photoinitiator to be added may be designed to be in a range from 5 to 40 parts by weight and preferably 10 to 20 parts by weight based on 100 parts by weight of nonvolatile components of the resin composition.

The following compounds among the aforementioned initiators may be used as the photoinitiator to be contained in the blue resist material. Examples of these compounds include aromatic ketones, benzoin ethers, benzoins, imidazole dimers, halomethylthiazole compounds, halomethyl-S-triazine type compounds, benzophenone, [4-(methylphenylthio)phenyl]phenylmethanone, ethylanthraquinone, isoamyl p-dimethylaminobenzoate, ethyl p-dimethylaminobenzoate, 2,2-dimethoxy-1,2-diphenylethan-1-one, 1-hydroxy-cyclohexyl-phenyl-ketone, 2-hydroxy-2-methyl-1-phenyl-propan-1-one, 1-hydroxy-cyclohexyl-phenyl-ketone, 1-[4-(2-hydroxyethoxy)-phenyl]-2-hydroxy-2-methyl-1-propan-1-one, 2-methyl-1 [4-(methylthio)phenyl]-2-morpholinopropan-1-one, methylbenzoin formate, benzoinisobutyl ether, benzyldimethylketal, 2,4,6-trimethylbenzophenone, 4-methylbenzophenone, (2-hydroxy-2-methyl-1-(4-(1-methylvinyl)phenyl)propanone, 2-[(2-dimethylaminoethyl) amino]-4,6-bis(trichloromethyl)-S-triazine-dimethyl sulfate, 2-(4-methoxyphenyl)-4,6-bis(trichloromethyl)-S-triazine, 2-methyl-4,6-bis(trichloromethyl)-S-triazine, 2,4, 6-tris (trichloromethyl)-S-triazine, QUANTACURE ITX, ABQ, CPTX, BMS, EPD, DMB, MCA and EHA manufactured by Octel Chemicals and TAZ-100, 101, 102, 104, 106, 107 and 108 manufactured by Midori Kagaku.

Examples of materials which may be used as the photoinitiator to be contained in the green resist material include the aforementioned initiators for a blue resist material, 2,4-diethylthioxanthone, 2-chlorothioxanthone, 2-benzyl-2-dimethylamino-1-(4-morpholinophenyl)-butanone-1, 2-[2-(furan-2-yl)ethenyl]-4,6-bis(trichloromethyl)-S-triazi ne, 2-[2-(5-methylfuran-2-yl)ethenyl]-4,6-bis(trichloromethyl)-S-triazine, 2-[2-(3,4-dimethoxyphenyl)ethenyl]-4,6-bis (trichloromethyl) -S-triazine, acylphosphine oxides such as bis(2,6-dimethoxybenzoyl)-2,4,4-trimethyl-pentylphosphine oxide and bis (2,4,6-trimethylbenzoyl)-phenylphosphine oxide, QUANTACURE QTX manufactured by Octel Chemicals, TAZ-110, 113, 118, 120, 121, 122 and 123 manufactured by Midori Kagaku and ESA CURE KTO 46 manufactured by Lamberti.

Examples of materials which may be used as the photoinitiator to be contained in the red resist material include the aforementioned initiators for a green resist material, metallocene such as 2,2'-bis(o-chlorophenyl)-4,5,4',5'-tetraphenyl-1,2'-biimida zole, 4,4'-diethylaminobenzophenone, bis($\eta^5$-2,4-cyclopentadiene-1-yl)-bis(2,6-difluoro-3-(1H-pyrrole-1-yl)-phenyl)titanium and $\eta^5$-cyclopentadienyl-$\eta^6$-cumenyl-iron (1+)-hexafluorophosphate (1−), 2-[2-(4-diethylamino-2-methylphenyl)ethenyl]-4,6-bis(trichl oromethyl)-S-triazine and TAZ-114 manufactured by Midori Kagaku.

The colored resist material set of the present invention is characterized by the use of a combination of two or more photoinitiators such as those aforementioned. As the pattern of this combination, the following three types may be exemplified.

1. A pattern using three types of photoinitiator (a photoinitiator having a photoabsorption region on the side of wavelengths lower than 570 nm, a photoinitiator having a photoabsorption region on the side of wavelengths lower than 460 nm and a photoinitiator having a photoabsorption region on the side of wavelengths lower than 400 nm) which are adaptable to each of the red resist material, green resist material and blue resist material.
2. A pattern using the same photoinitiator (a photoinitiator having a photoabsorption region on the side of wavelengths lower than 460 nm) as the photoinitiators to be contained respectively in the red resist material and the green resist material and using a photoinitiator having a photoabsorption region on the side of wavelengths lower than 400 nm as the photoinitiator to be contained in the blue resist material.
3. A pattern using a photoinitiator having a photoabsorption region on the side of wavelengths lower than 570 nm as the photoinitiator to be contained in the red resist material and using the same photoinitiator (a photoinitiator having a photoabsorption region on the side of wavelengths lower than 400 nm) as the photoinitiators to be contained respectively in the green resist material and the blue resist material.

Among the above patterns, in the present invention, it is preferable to use a photoinitiator having a photoabsorption region on the side of wavelengths lower than 400 nm as the photoinitiator to be contained in the blue resist material and to use the same photoinitiator (a photoinitiator having a photoabsorption region on the side of wavelengths lower than 460 nm as the photoinitiators to be contained respectively in the green resist material and the red resist material (the above pattern (2)).

Because many photoinitiators which are currently used have a photoabsorption region on the side of shorter wavelengths, blue light having the shortest wavelength among three primary color lights is mostly affected by the photoinitiator. Therefore, it is unnecessary for these photoinitiators to be different from each other in all color colored resist materials having three colors respectively, but only the photoinitiator contained in the blue resist material is made to have a photoabsorption region on the side of wavelengths shorter than 400 nm, whereby even the blue light can be made free from the influence of the photoinitiator. Also, the number of the types of photoinitiator to be used can be decreased to two and therefore the cost when three color resist materials are manufactured can be decreased.

With regard to the lamp used when the aforementioned resist material according to the present invention is irradiated with light, productive efficiency can be improved by using a lamp which emits light absorbed most by a photoinitiator contained in each resist material. Therefore, the method of the present invention is desirable also in this point.

For example, Irgacure 369 (manufactured by Ciba Specialty Chemicals) that is one of photoinitiators which can be contained in the red resist material and the green resist material most absorbs light having a wavelength of about 290 to 365 nm. It is therefore preferable to use a lamp (e.g., a mercury lamp) which emits light having a wavelength in this range. On the other hand, Irgacure 907 (manufactured by Ciba Specialty Chemicals) that is one of photoinitiators which can be contained in the blue resist material most absorbs light having a wavelength of about 260 to 330 nm. It is therefore preferable to use a lamp which emits light having a wavelength in this range.

(3) Dyes and/or Pigments

The dyes and/or pigments to be contained in each colored resist material (the red resist material, the green resist material and the blue resist material) contained in the colored resist material set of the present invention are used to color the resist material. As the dyes and/or the pigments, known dyes and pigments may be used. Given as examples of these dyes and pigments as their chemical structures are a anthraquinone type, isoindoline type, isoindolinone type, azo type, pyrrolopyrrole type, quinophthalone type, phthalocyanine type, sulene type, triphenylmethane type, triallylmethane type, quinacridone type, dioxazine type, perylene type, perynone and metal complexes of these types. As these organic dyes, those having a pigment form are preferable for applications in color filters in view of light resistance and heat resistance. Pigments preferable in view of hue for a color filter are PR177, PR254 and PR48:1 as red pigments, PY83, PY139, PY138 and PY150 as yellow pigments, PG7 and PG36 as green pigments, pigments of the 15-numer mark such as PB15:3 and PB15:6, PB60, PB61, PB1 and PB19 as blue pigments and PV 23 as violet pigments. Also, these pigments are mixed to regulate the transmission spectrum such that the photoabsorption wavelength region of the initiator is just barely prevented from overlapping on the major light transmission region of pixels, whereby the hue can be controlled and the brightness can be improved. Preferable combinations of pigments to be mixed are as follows.

A combination for a red pixel: PR177+PY139, PR177+PY83, PR254+PY139 and PR254+PY83.

A combination for a green pixel: PG7+PY83, PG36+PY150 and PG36+PY138.

A combination for a blue pixel: PB15:6+PV23, PB15:3+PV23 and PB15:6+PB60.

(4) Additives Including a Dispersant

In each colored resist material (the red resist material, the green resist material and the blue resist material) used in the colored resist material set of the present invention, additives such as a dispersant, a solvent and the like may be added. For example, a dispersant used to disperse the aforementioned dyes and/or pigments uniformly in the resist may be exemplified. As such a dispersant, known dispersants which are currently used may be adopted and, for example, high molecular dispersants such as a modified polyurethane, modified polyacrylate, modified polyester and modified polyamide, surfactants such as a phosphate, polyether and alkylamine and organic dye derivatives may be used. Examples of the organic dye derivatives may include compounds prepared by adding a carboxyl group, sulfonic acid group, amino group, carbonyl group or sulfonyl group to the skeleton of an organic dye (e.g., pigments and dyes) such as a phthalocyanine type, azo type, anthraquinone type or quinacridone type and salts of these compounds.

Also, a binder resin and a solvent may be contained according to the need. Specific examples of the binder resin include an ethylene/vinyl acetate copolymer, copolymer, ethylene/vinyl chloride copolymer, ethylene vinyl copolymer, polystyrene, acrylonitrile/styrene copolymer, ABS resin, polymethacrylic acid resin, ethylenemethacrylic acid resin, polyvinyl chloride resin, chlorinated vinyl chloride, polyvinyl alcohol, cellulose acetate propionate, cellulose acetate butylate, Nylon 6, Nylon 66, Nylon 12, polyethylene terephthalate, polybutylene terephthalate, polycarbonate, polyvinylacetal, polyether ether ketone, polyether sulfone, polyphenylene sulfide, polyacrylate, polyvinylbutyral, epoxy resin, phenoxy resin, polyimide resin, polyamideimide resin, polyamic acid resin, polyether imide resin, phenol resin, urea resin and polymers or copolymers comprising one or more polymerizable monomers such as methylacrylate, methylmethacrylate, ethylacrylate, ethylmethacrylate, n-propylacrylate, n-propylmethacrylate, isopropylacrylate, isopropylmethacrylate, sec-butylacrylate, sec-butylmethacrylate, isobutylacrylate, isobutylmethacrylate, tert-butylacrylate, tert-butylmethacrylate, n-pentylacrylate, n-pentylmethacrylate, n-hexylacrylate, n-hexylmethacrylate, 2-ethylhexylacrylate, 2-ethylhexylmethacrylate, n-octylacrylate, n-octylmethacrylate, n-decylacrylate, n-decylmethacrylate, styrene, α-methylstyrene, N-vinyl-2-pyrrolidone and glycidyl (meth)acrylate and one or more of acrylic acid, methacrylic acid, acrylic acid dimer (e.g., M-5600, manufactured by Toagosei Chemical Industry), itaconic acid, crotonic acid, maleic acid, fumaric acid, vinylacetic acid and acid anhydrides of these acids.

Polymers obtained by adding an ethylenic unsaturated compound having a glycidyl group or a hydroxyl group to the above copolymers are also exemplified. However, the binder resin used in the present invention is not limited to these compounds.

Among the aforementioned binder resins, it is preferable to use a polymethylmethacrylate resin, polyethylmethacrylate resin, copolymer of polymethylmethacrylate resin and polyethylmethacrylate resin, phenoxy resin, epoxy resin, polycarbonate resin, polystyrene resin, cellulose acetate propionate, cellulose acetate butylate, ethylhydroxyethyl cellulose, cellulose triacetate and the like in view of compatibility with the monomer used together. It is particularly preferable to use a polymethylmethacrylate resin, polyethylmethacrylate resin, polystyrene resin, a copolymer of methacrylic acid and styrene or glycidylmethacrylate, phenoxy resin, epoxy resin and modified products of these resins or copolymers, Particularly preferable examples of the binder resin include Epicoat series manufactured by Mitsubishi Yuka Shell, Seloxide series and Epolead series manufactured by Daicel or a bisphenol-A type epoxy resin, bisphenol-F type resin, bisphenol-S type epoxy resin, novolac type epoxy resin, polyglycidyl carboxylate, polyol glycidyl ester, aliphatic or alicyclic epoxy resin, amine epoxy resin, triphenolmethane type epoxy resin, dihydroxybenzene type epoxy resin and copolymer epoxy compound of glycidyl (meth)acrylate and a radical-polymerizable monomer.

The content of such a binder resin is in a range from 10 to 90% by weight and preferably 20 to 80% by weight based on the nonvolatile components of the resin composition.

Example of the solvent include alcohols such as methanol, ethanol, n-propanol, isopropanol, ethylene glycol and propylene glycol, terpenes such as α- or β-terpineol, ketones such as acetone, methyl ethyl ketone, cyclohexanone and N-methyl-2-pyrrolidone, aromatic hydrocarbons such as toluene, xylene and tetramethylbenzene, glycol ethers such as cellosolve, methyl cellosolve, ethyl cellosolve, carbitol, methyl carbitol, ethyl carbitol, butyl carbitol, propylene glycol monomethyl ether, propylene glycol monoethyl ether, dipropylene glycol monomethyl ether, dipropylene glycol monoethyl ether, triethylene glycol monomethyl ether and triethylene glycol monoethyl ether and acetates such as ethyl acetate, butyl acetate, cellosolve acetate, ethyl cellosolve acetate, butyl cellosolve acetate, carbitol acetate, ethyl carbitol acetate, butyl carbitol acetate, propylene glycol monomethyl ether acetate and propylene glycol monoethyl ether acetate.

Since the color filter of the present invention is provided with a colored resist material formed using the colored resist material set of the present invention as mentioned above, the light transmittance is never reduced caused by the photoinitiator in the colored resist. Also, the white balance (the balance of chromaticity and/or luminance between R, G and B) of whole pixels is not destroyed, giving rise to no problem concerning the luminance and tint of a liquid crystal display and the like.

As the method of producing the color filter of the present invention, known methods which are currently used may be used. Among these methods, a pigment dispersing method is desirable.

EXAMPLE

Example 1

A color filter was formed using colored resist material sets shown in the following Tables 1 to 3.

(1) Colored Resist Material Sets Used

TABLE 1

| Component | Compound Name | Content |
| --- | --- | --- |
| Reactive monomer | DPHA (dipentaerythritol hexaacrylate) | 4.0 parts by weight |
| Photoinitiator | Trademark: Irgacure 369 (Ciba Specialty Chemicals) | 2.0 parts by weight |
| Pigment | | |
| Red pigment | P.R. 177 | 4.8 parts by weight |

TABLE 1-continued

| Component | Compound Name | Content |
| --- | --- | --- |
| Yellow pigment | P.Y. 139 | 1.2 parts by weight |
| Pigment dispersant | Trademark: Solsperse 24000 (manufactured by Avecia) | 3.0 parts by weight |
| Solvent | Propylene glycol monomethyl ether acetate | 80.0 parts by weight |
| Binder | Polymer 1 | 5.0 parts by weight |

[2] Green Resist Material

TABLE 2

| Component | Compound Name | Content |
| --- | --- | --- |
| Reactive monomer | DPHA (dipentaerythritol hexaacrylate) | 4.0 parts by weight |
| Photoinitiator | Trademark: Irgacure 369 (Ciba Specialty Chemicals) | 2.0 parts by weight |
| Pigment | | |
| Green pigment | P.G. 36 (completely brominated phthalocyanine Green) | 4.2 parts by weight |
| Yellow pigment | P.Y. 139 | 1.8 parts by weight |
| Pigment dispersant | Trademark: Solsperse 24000 (manufactured by Avecia) | 3.0 parts by weight |
| Solvent | Propylene glycol monomethyl ether acetate | 80.0 parts by weight |
| Binder | Polymer 1 | 5.0 parts by weight |

[3] Blue Resist Material

TABLE 3

| Component | Compound Name | Content |
| --- | --- | --- |
| Reactive monomer | DPHA (dipentaerythritol hexaacrylate) | 4.0 parts by weight |
| Photoinitiator | Trademark: Irgacure 907 (Ciba Specialty Chemicals) | 2.0 parts by weight |
| Pigment | | |
| Blue pigment | P.B 15:6 | 6.0 parts by weight |
| Pigment dispersant | Trademark: Solsperse 24000 (manufactured by Avecia) | 2.4 parts by weight |
| Pigment derivatives | Trademark: Solsperse 12000 (manufactured by Avecia) | 0.6 parts by weight |
| Solvent | Propylene glycol monomethyl ether acetate | 80.0 parts by weight |
| Binder | Polymer 1 | 5.0 parts by weight |

Polymer 1 is a copolymer of benzylmethacrylate: styrene: acrylic acid: 2-hydroxyethylmethacrylate=15.6: 37.0: 30.5: 16.9 (mol ratio).

The Color Index Numbers are shown in the description of the pigments.

(2) Method of the Production of a Color Filter

A 100-mm-long, 100 mm-wide, 0.7 mm-thick glass substrate formed with a black matrix was prepared as a color filter substrate. Next, a colored layer was formed using a colored resist set having the above composition. Specifically, the aforementioned blue resist material was applied to the substrate by a spin coating method (coating step) and prebaked (90° C., 3 minutes) (prebaking step). Thereafter, the colored resist layer was subjected to alignment exposure using a photomask for a predetermined color pattern to cure only the resist material corresponding to the portion irradiated with light (exposure step). Next, the colored resist layer was developed using a developing solution (aqueous 0.05% KOH solution) (developing step) and post-baked (200° C., 3 minutes) (film-forming step), followed by washing with pure water (washing step) to form a blue pattern having a thickness of 1.5 μm at a predetermined position on the black matrix pattern. Here, a mercury lamp was used for the exposure.

A green resist pattern was formed and finally a red resist pattern was formed in the same manner as above.

Example 2

(1) Colored Resist Material Set to be Used

The same resist material as that used in Example 1 was used except that a red resist material described in Table 4 shown below was used as the red resist material.

TABLE 4

| Component | Compound Name | Content |
| --- | --- | --- |
| Reactive monomer | DPHA (dipentaerythritol hexaacrylate) | 4.0 parts by weight |
| Photoinitiator 1 | 2,2'-Bis(o-chlorophenyl)-4,5,4',5'-tetraphe nyl-1,2'-biimidazole | 1.4 parts by weight |
| Photoinitiator 2 | Diethylaminobenzophenone | 0.6 parts by weight |
| Pigment | | |
| Red pigment | P.R. 177 | 4.8 parts by weight |
| Yellow pigment | P.Y. 139 | 1.2 parts by weight |
| Pigment dispersant | Trademark: Solsperse 24000 (manufactured by Avecia) | 3.0 parts by weight |
| Solvent | Propylene glycol monomethyl ether acetate | 80.0 parts by weight |
| Binder | Polymer 1 | 5.0 parts by weight |

(2) Method of the Formation of a Color Filter

A color filter was formed in the same manner as in Example 1.

[Results of Evaluation]

The color filters obtained in the aforementioned Examples 1 and 2 were compared with conventional color filters (those using only one photoinitiator). This comparison was made for the Y value (Y means Y among three stimulation values X, Y and Z, and corresponds to a brightness) of a blue pixel and the color temperature of white (the color temperature corresponds to the chromaticity of white. When the color temperature is low, the color becomes yellowish whereas when the color temperature is high, the color becomes bluish). An F10 light source was used as a light source for evaluation.

As a result, the Y value of the blue pixel when y=0.160 was as follows: the Y value of the conventional color filter=14 whereas the Y values of the color filters obtained in Examples 1 and 2 respectively=15, with the result that the luminance was improved. Here, y means is y in the chromaticity coordinate (x, y). Also, the color temperature of white was 4600 kelvin in the case of the conventional color filter and 4700 kelvin in the case of the color filters obtained in Examples 1 and 2. This implies that the conventional color filter was yellowish white whereas the color filter of the present invention was decreased in yellowish color. Namely, a display color filter having a white color more desirable than conventional color filters could be obtained.

What is claimed is:

1. A colored resist material set comprising: at least colored resist materials having three colors respectively and consisting of
    a red resist material a green resist material and a blue resist material, each resist material containing a reactive monomer, a photoinitiator and a dye and/or a pigment, wherein;
    the photoinitiator contained in said red resist material has a photoabsorption region which absorbs wavelengths shorter than 570 nm;
    the photoinitiator contained in said green resist material has a photoabsorption region which absorbs wavelengths shorter than 460 nm; and
    the photoinitiator contained in said blue resist material has a photoabsorption region which absorbs wavelengths shorter than 400 nm;
    wherein the photoabsorption region of at least one photoinitiator contained in said red and green resist materials absorbs wavelengths longer than wavelengths absorbed by the photoabsorption region of the photoinitiator contained in said blue resist material.

2. A colored resist material set according to claim 1, wherein the photoinitiators contained in said red resist material and said green resist material each have a photoabsorption region which absorbs wavelengths shorter than 460 nm, and longer than wavelengths absorbed by the photoabsorption region of the photoinitiator contained in said blue resist material.

3. A colored resist material set according to claim 2, wherein the photoinitiators contained in the red resist material and the green resist material each are 2-benzyl-2-dimethylamino-1-(4-morpholinophenyl)—butanone-1; and the photoinitiator contained in said blue resist material is 2-methyl-1 [4-{4-(methylthio)phenyl]-2-morpholinopropan-1-one.

4. A color filter formed by a colored resist using a colored resist material set comprising:
    a red resist material, a preen resist material and a blue resist materiel, each resist material containing a reactive monomer, a photoinitiator and a dye and/or a pigment, wherein;
    the photoinitiator contained in said red resist material has a photoabsorption region which absorbs wavelengths shorter than 570 nm;
    the photoinitiator contained in said green resist material has a photoabsorption region which absorbs wavelengths shorter than 460 nm; and
    the photoinitiator contained in said blue resist material has a photoabsorption region which absorbs wavelengths shorter than 400 nm;
    wherein the photoabsorption region of at least one photoinitiator contained in said red end green resist materials absorbs wavelengths longer than wavelengths absorbed by the photoabsorption region of the photoinitiator contained in said blue resist material.

5. A color filter according to claim 4, wherein the photoinitiators contained in said red resist materiel and said green resist materiel each have a photoabsorption region which absorbs wavelengths shorter than 460 nm, and longer than wavelengths absorbed by the photoabsorption region of the photoinitiator contained in said blue resist material.

6. A color filter according to claim 5, wherein the photoinitiators contained in the red resist material and the green resist material each are 2-benzyl-2-dimethylamino-1-(4-morpholinophenyl)-butanone-1; and the photoinitiator contained in said blue resist material is 2-methyl-1[4-(methylthio)phenyl]-2-morpholinopropan-1-one.

* * * * *